US006407421B1

(12) United States Patent
Liu et al.

(10) Patent No.: US 6,407,421 B1
(45) Date of Patent: Jun. 18, 2002

(54) DRAM HAVING A GUARD RING AND PROCESS OF FABRICATING THE SAME

(75) Inventors: Sheng M. Liu, Kaohsiung; Tzu-Ching Tsai, Taichung Hsien, both of (TW)

(73) Assignee: Nanya Technology Corporation, Taoyuan (TW)

( * ) Notice: Subject to any disclaimer, the term of this patent is extended or adjusted under 35 U.S.C. 154(b) by 25 days.

(21) Appl. No.: 09/658,685

(22) Filed: Sep. 8, 2000

(30) Foreign Application Priority Data

May 20, 2000 (TW) ........................................ 89109738 A

(51) Int. Cl.⁷ ..................... H01L 27/108; H01L 29/76; H01L 29/94; H01L 31/119; H01L 23/62

(52) U.S. Cl. ..................... 257/296; 257/301; 257/302; 257/355

(58) Field of Search ................................. 257/295–310, 257/530–535, 355; 438/241–254, 396–398, 155

(56) References Cited

U.S. PATENT DOCUMENTS 5,945,713 A  *  8/1999  Voldman ..................... 257/355
6,323,689 B1  *  11/2001  Morishita .................... 257/355

* cited by examiner

*Primary Examiner*—Tom Thomas
*Assistant Examiner*—Cuong Quang Nguyen
(74) *Attorney, Agent, or Firm*—Darby & Darby

(57) ABSTRACT

A DRAM having a guard ring comprises a semiconductor substrate having a memory array area and a guard ring area; a first trench disposed on said memory array area; a second trench disposed on said guard ring area; a first doped strap disposed on the upper surface of said semiconductor substrate around said first trench; a second doped strap disposed on the upper surface of said semiconductor substrate around said second trench. Furthermore, the DRAM comprises a first doped plate disposed on said semiconductor substrate around the bottom of said first trench, and is separated from said first doped strap by a predetermined distance; and a second doped plate disposed on said semiconductor substrate around the bottom of said second trench, and is connected to said second doped strap.

4 Claims, 12 Drawing Sheets

DRAM HAVING A GUARD RING AND PROCESS OF FABRICATING THE SAME

BACKGROUND OF THE INVENTION

1. Field of the Invention

The present invention relates in general to a dynamic random access memory (DRAM) having a trench-type capacitor. More particularly, the present invention relates to a DRAM having a guard ring and processes of fabricating the same.

2. Description of the Related Art

A memory device stores data at specified voltage levels in an array of the cells. Conventionally, the voltage levels represent that the data is either a logical "1" or a logical "0". In dynamic random access memory devices, for example, the cells store the data as a charge on capacitor. When the data is read from the memory device, sense amplifiers detect the level of charge stored on a particular capacitor so as to produce a logical "1" or logical "0" output based on the stored charge.

Typically, in a DRAM fabricating process, a guard ring is formed on the peripheral circuit area to prevent electrostatic discharge from damaging the memory device.

FIGS. 1A through 1E and FIG. 3 illustrate a process flow of the fabrication of a DRAM having a guard ring according to a prior art.

Referring now to FIG. 1A and FIG. 3, a cross-sectional view of semiconductor substrate 10 having a memory array area I and a guard ring area II is schematically shown. The semiconductor substrate 10 is selectively etched to respectively form a first trench 12 and a second trench 14 on the memory array area I and on the guard ring area II. These trenches 12, 14 both have length-width dimensions of about 0.45 $\mu$m×0.2 $\mu$m. Next, a first thermal oxide layer 16 having dopants and a second thermal oxide layer 18 having dopants are respectively formed on the sidewalls of the first trench 12 and the second trench 14 by in-situ doping thermal oxidation.

Next, as shown in FIG. 1B, an organic material 20, for example photoresist, is coated on the semiconductor substrate 10 and filled into the first trench 12 and second trench 14 by a spin coating method.

Referring to FIG. 1C, the organic material 20 is partially removed by reactive ion etching (RIE) to leave an organic material 20a within the first trench 12 and an organic material 20b within the second trench 14.

As shown in FIGS. 1C and 1D, a wet etching step is used to remove the exposed thermal oxide layer 16 and the exposed thermal oxide layer 18 so as to leave a thermal oxide 16a and a thermal oxide 18a, while the organic material 20a and the organic material 20b are used as etching masks.

Next, referring to FIG. 1E, the remaining organic material 20a and the remaining organic material 20b are removed. Then, a thermal treatment is utilized so that the dopants of the thermal oxide 16a and the thermal oxide 18a are diffused into the adjacent semiconductor substrate 10 to respectively form a first doped plate 22 and a second doped plate 24. These plates are called "buried plates" by those skilled in the art, and serve as storage electrodes of a trench-type capacitor. Next, a first doped strap 26 is formed on the upper surface of the semiconductor substrate 10 around the first trench 12. At the same time, a second doped strap 28 is formed on the upper surface of the semiconductor substrate 10 around the second trench 14. These straps are called "buried straps" by those skilled in the art, and connect the drain of MOS transistor formed in the subsequent step. Then, referring to FIG. 3, a photoresist mask is formed on the space S as shown by FIG. 3. Next, an implantation step is performed to form a N-well 30 so that the second doped strap 28 and the second doped plate 24 are electrically connected.

According to the method described above, formation of the N-well 30 is required so that the second doped strap 28 and the second doped plate 24 are electrically connected. As a result, space S having 0.65 $\mu$m width is needed. Therefore, wafer area is wasted. Moreover, the additional photo-mask for N-well 30 adds cost to the manufacturing process.

SUMMARY OF THE INVENTION

In view of the above disadvantages, an object of the present invention is to provide a DRAM having a guard ring so as to economize the wafer area and to reduce the manufacturing cost by alteration of the trench dimension on the guard ring area.

In order to achieve the above object, a DRAM having a guard ring is provided, the DRAM comprising: a semiconductor substrate having a memory array area and a guard ring area; a first trench disposed within said semiconductor substrate on said memory array area; a second trench disposed within said semiconductor substrate on said guard ring area; a first doped strap disposed on the upper surface of said semiconductor substrate around said first trench; a second doped strap disposed on the upper surface of said semiconductor substrate around said second trench; a first doped plate disposed on said semiconductor substrate around the bottom of said first trench, and separated from said first doped strap by a predetermined distance; and a second doped plate disposed on said semiconductor substrate around the bottom of said second trench, and connected to said second doped strap.

Furthermore, in an embodiment of the present invention, the first trench and the second trench respectively have length-width dimensions of about 0.45 $\mu$m×0.2 $\mu$m and 0.2 $\mu$m×0.2 $\mu$m.

Furthermore, in another embodiment of the present invention, the first doped strap and the second doped strap comprise n-type dopants. Moreover, the first doped plate and the second doped plate can comprise n-type dopants.

Furthermore, in order to achieve the above object, a process of fabricating a DRAM having a guard ring is provided, the process comprising the steps of: (a) providing a semiconductor substrate having a memory array area and a guard ring area; (b) selectively etching said semiconductor substrate to form a first trench on said memory array area and a second trench on said guard ring area respectively, wherein the dimension of said second trench is smaller than that of said first trench; (c) respectively forming a first thermal oxide layer containing dopants and a second thermal oxide layer containing dopants on the sidewalls of said first trench and said second trench; (d) partially removing said first and said second thermal oxide layers so that the distance between the top portion of said first trench and the remaining first thermal oxide layer is larger than that between the top portion of said second trench and the remaining second thermal oxide layer; (e) performing a thermal treatment to diffuse said dopants of said first and said second thermal oxide layers into adjacent semiconductor substrate to form a first doped strap and a second doped strap respectively; (f) respectively forming a first doped plate and a second doped plate on the upper surfaces of said semiconductor substrate around said first trench and said second trench so that said first doped strap is separated from said first doped plate by a predetermined distance, and said second doped strap is connected to said second doped plate.

BRIEF DESCRIPTION OF THE DRAWINGS

The preferred embodiment of the invention is hereinafter described with reference to the accompanying drawings in which.

DESCRIPTION OF THE PREFERRED EMBODIMENTS

The following preferred embodiment of the invention is illustrated in reference with FIGS. 2A through 2F and FIG. 4 of the accompanying drawings.

Figure 1A:
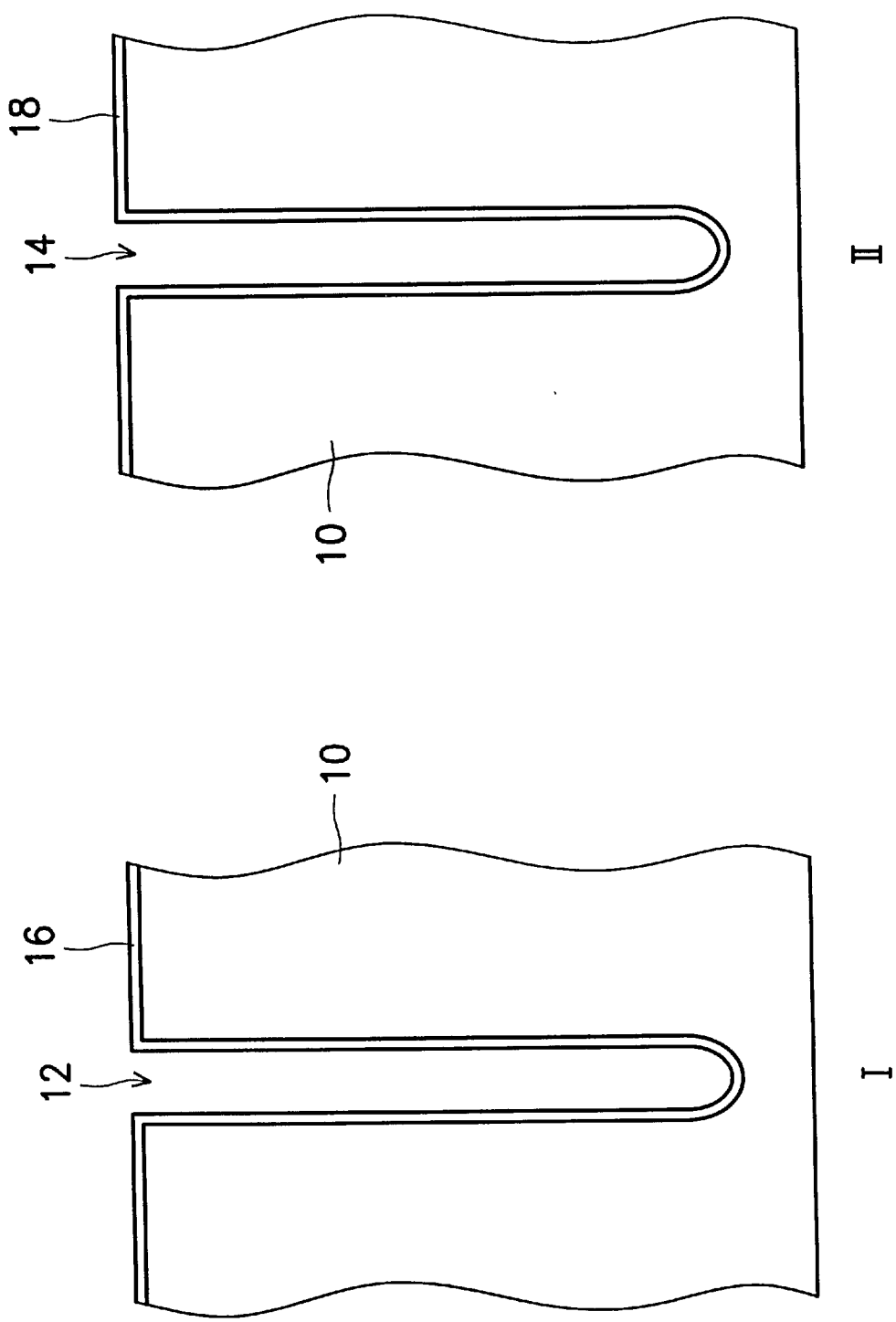
FIGS. 1A through 1E are cross-sectional side views showing the steps of fabricating a DRAM having a guard ring according to the method of the prior art.
Figure 1B:
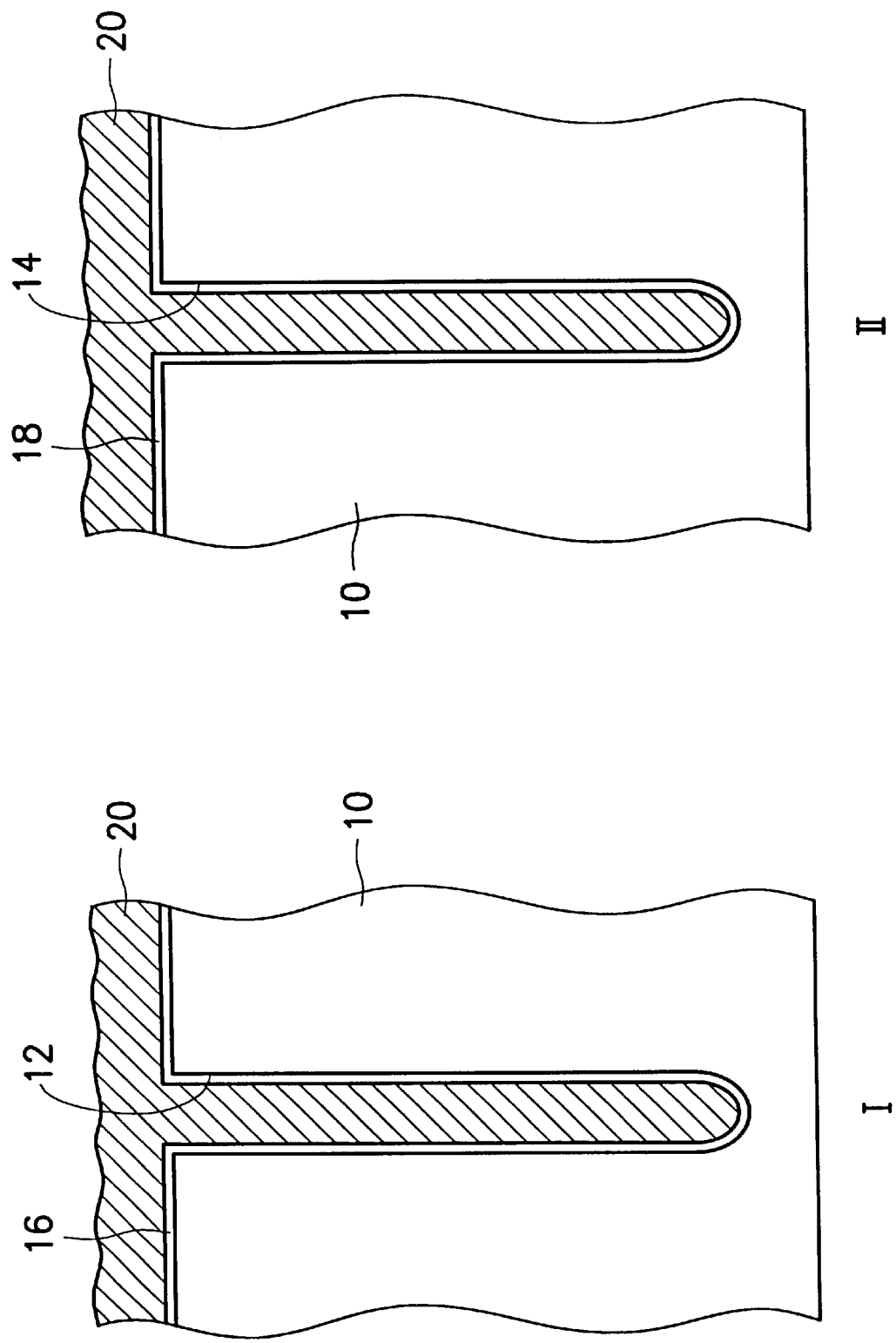
Figure 1C:
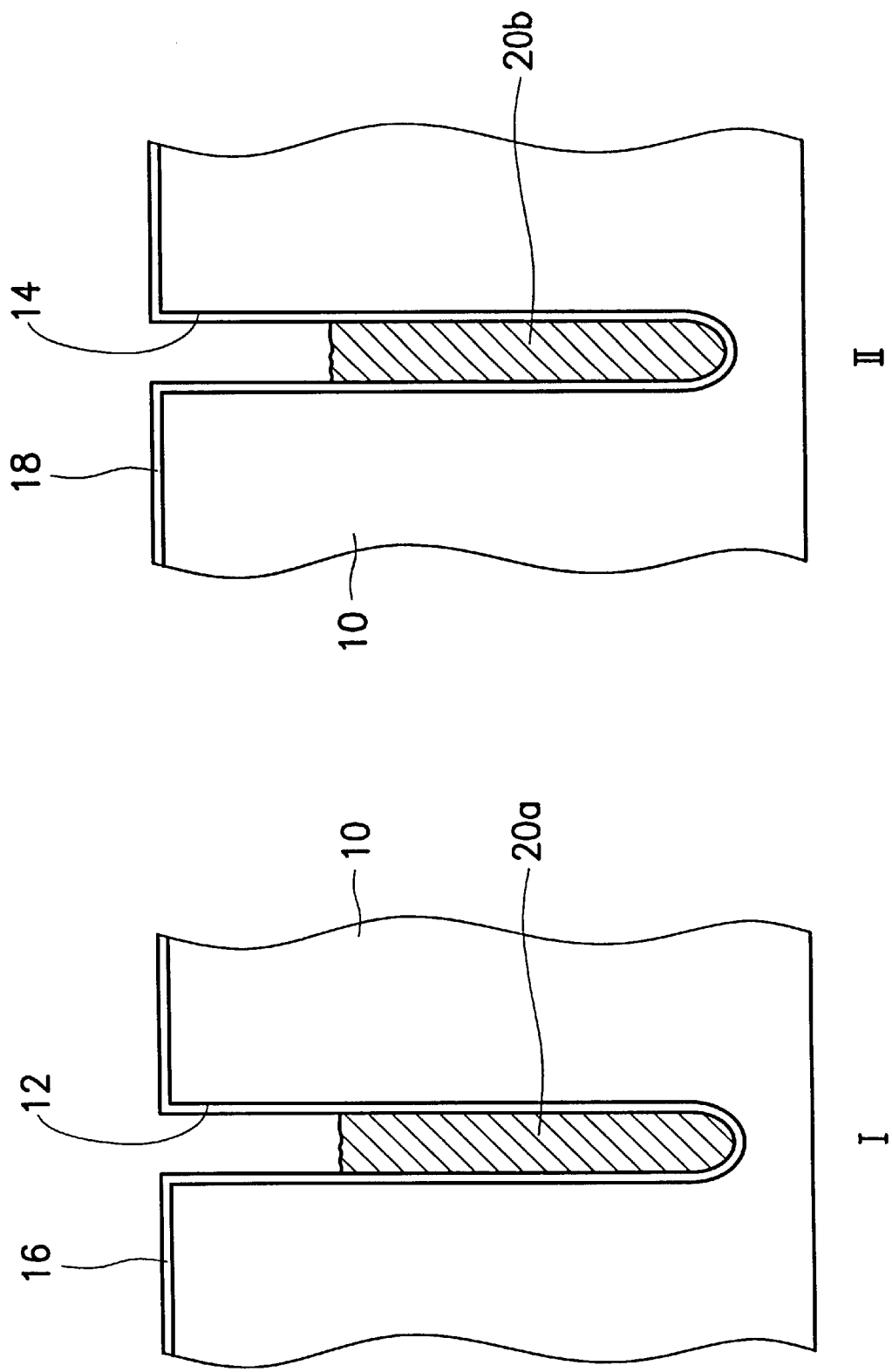
Figure 1D:
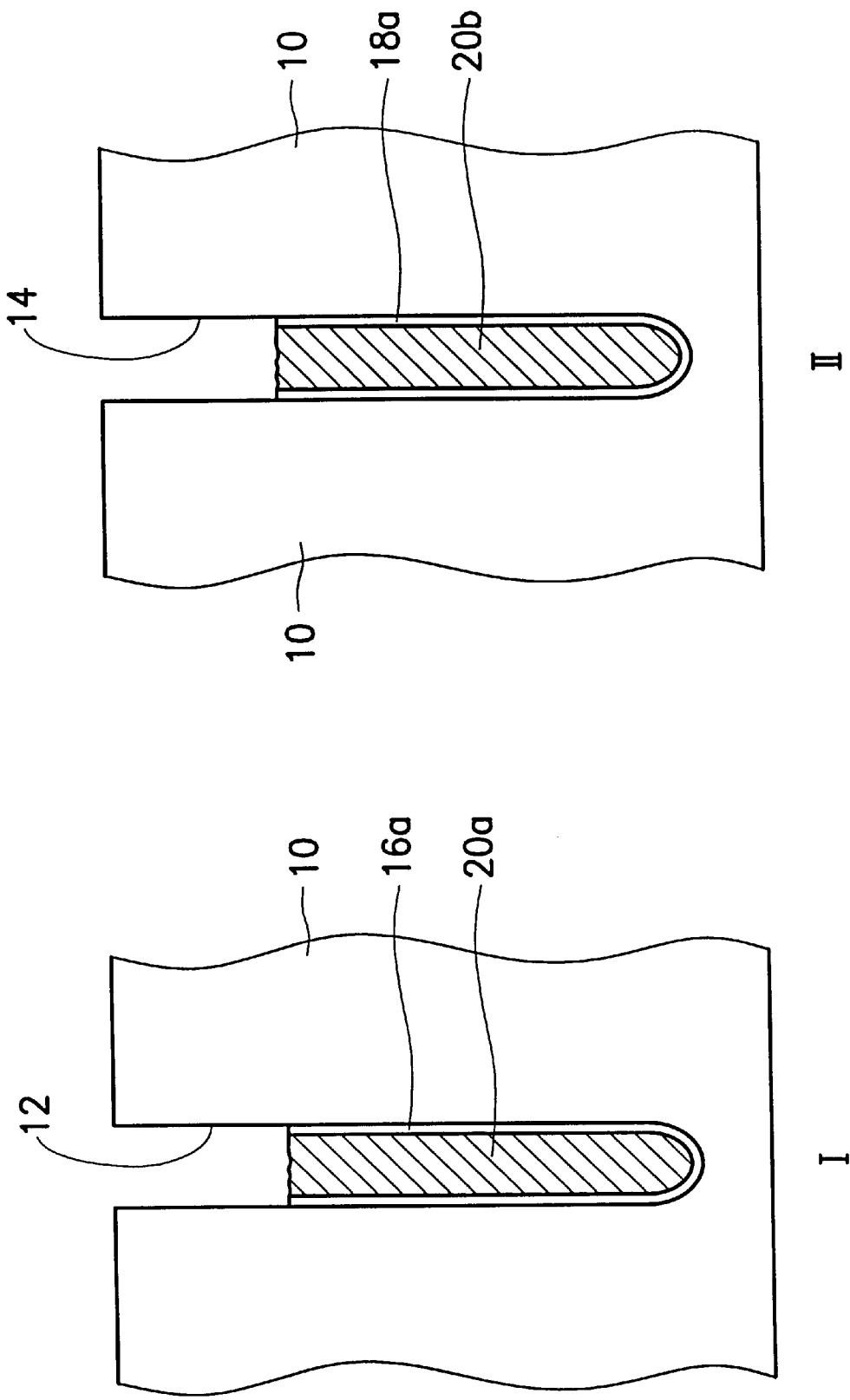
Figure 1E:
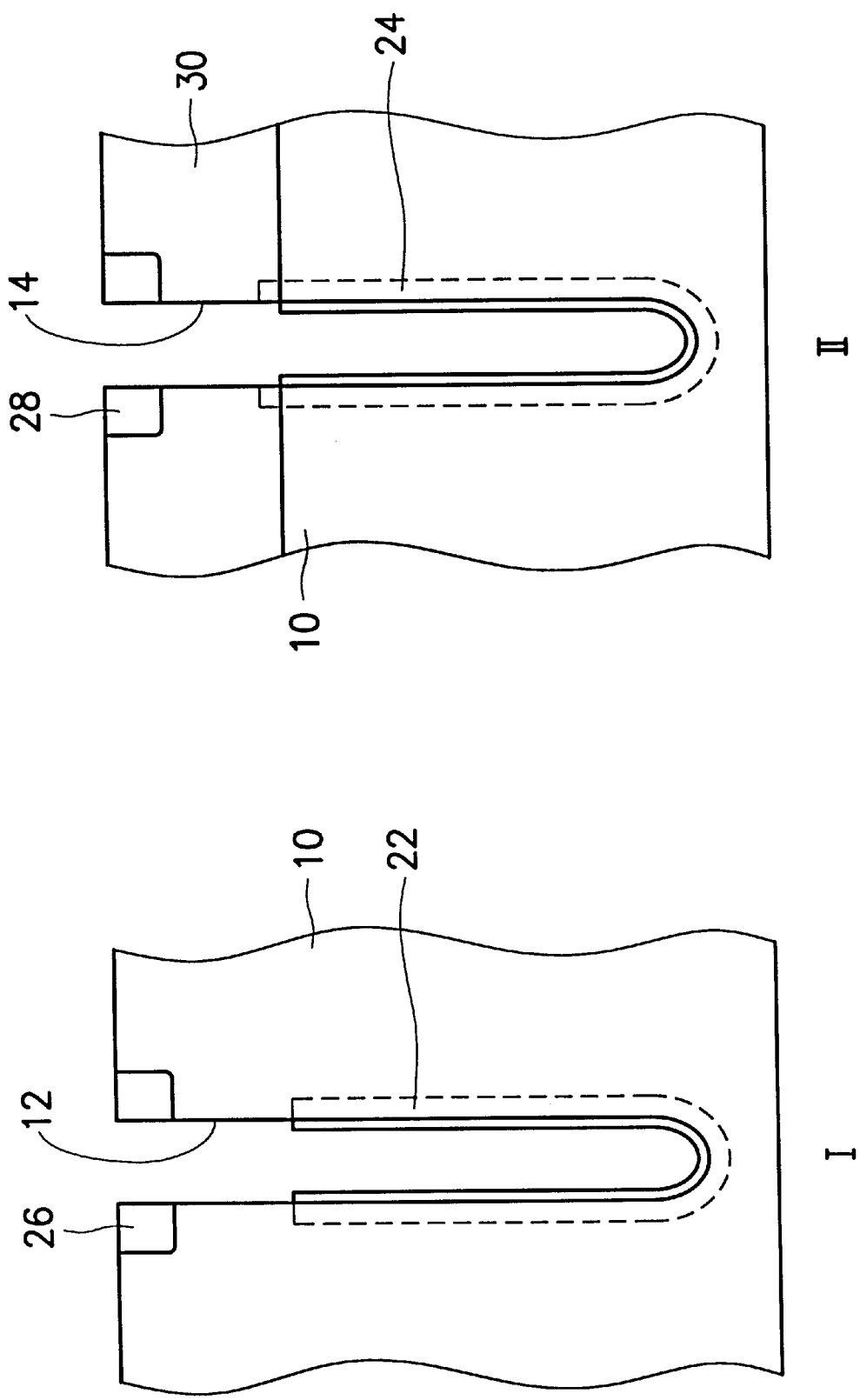
Figure 2A:
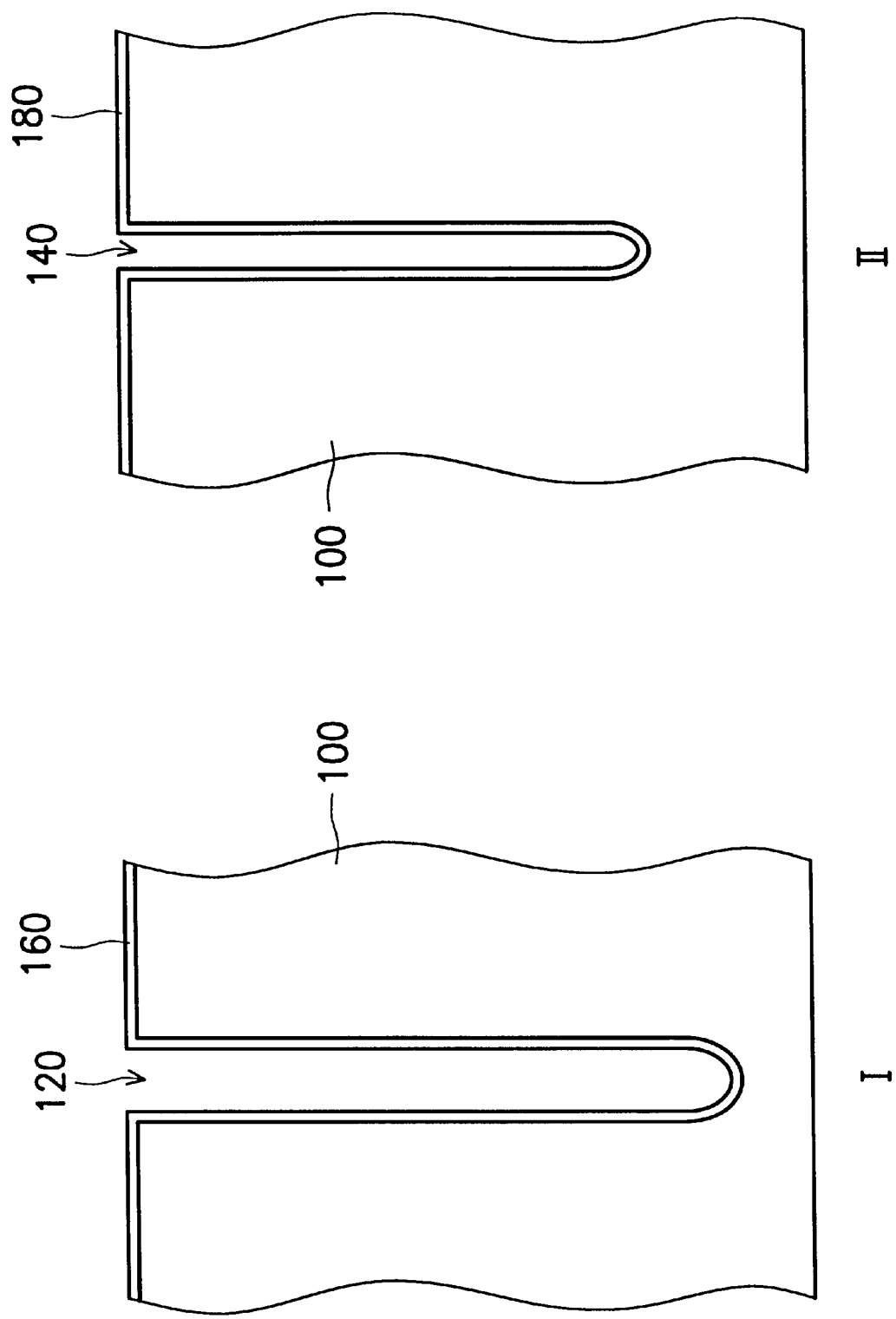
FIGS. 2A through 2F are cross-sectional side views showing the steps of fabricating a DRAM having a guard ring according to the method of the present invention.
Figure 4:
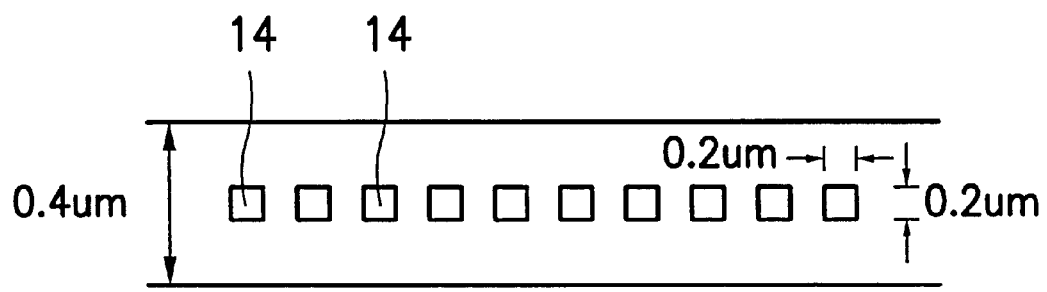
FIG. 4 is the top view of a guard ring area formed by the present invention.

Referring now to FIG. 2A and FIG.4, a cross-sectional view of semiconductor substrate 100 having a memory array area I and a guard ring area II is schematically shown to represent the starting step. As shown in FIG. 2A and FIG.4, the semiconductor substrate 100 is selectively etched to form a first trench 120, which has a length-width dimension of about 0.45 $\mu$m×0.2 $\mu$m, on the memory array area I and a second trench 140, which has a length-width dimension of about 0.2 $\mu$m×0.2 $\mu$m on the guard ring area II. Next, a first thermal oxide layer 160 having dopants and a second thermal oxide layer 180 having dopants are respectively formed on the sidewalls of the first trench 120 and the second trench 140 by in-situ doping thermal oxidation. The dopants doped into the first and the second oxide layers 160, 180 are preferably arsenic or phosphorus.

Figure 2B:
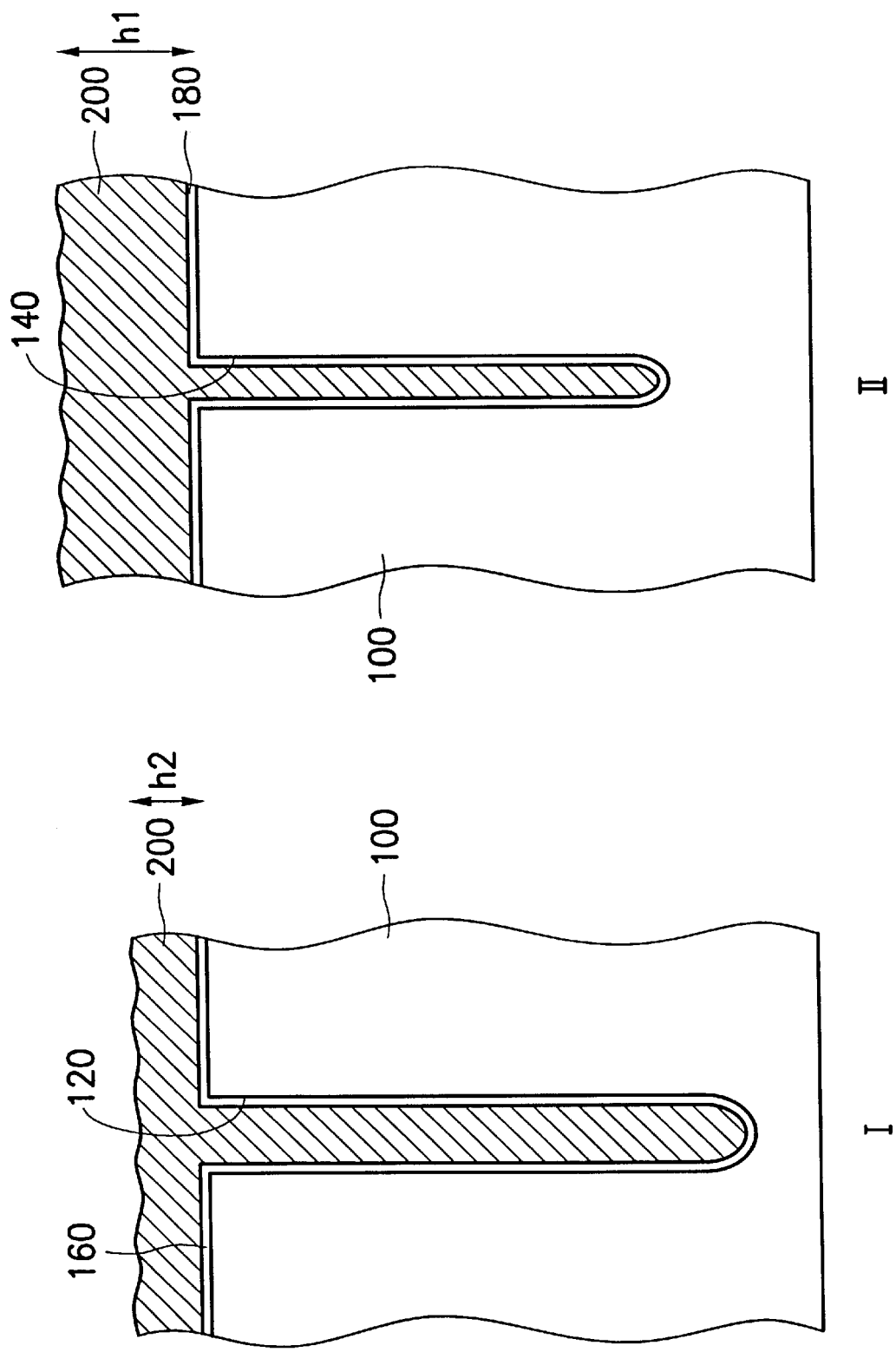

Next, as shown in FIG. 2B, an organic material 200, for example photoresist (PR), is coated on the semiconductor substrate 100 and filled into the first trench 120 and second trench 140 by a spin coating method. Because the dimension and density of the first trench 120 at the memory array area I are larger than those of the second trench 140 at guard ring area II, the PR thickness or highness h1 of the organic material 200 on the semiconductor substrate 100 at guard ring area II is thicker than the PR thickness or highness h2 on the semiconductor substrate 100 at the memory array area I.

Figure 2C:
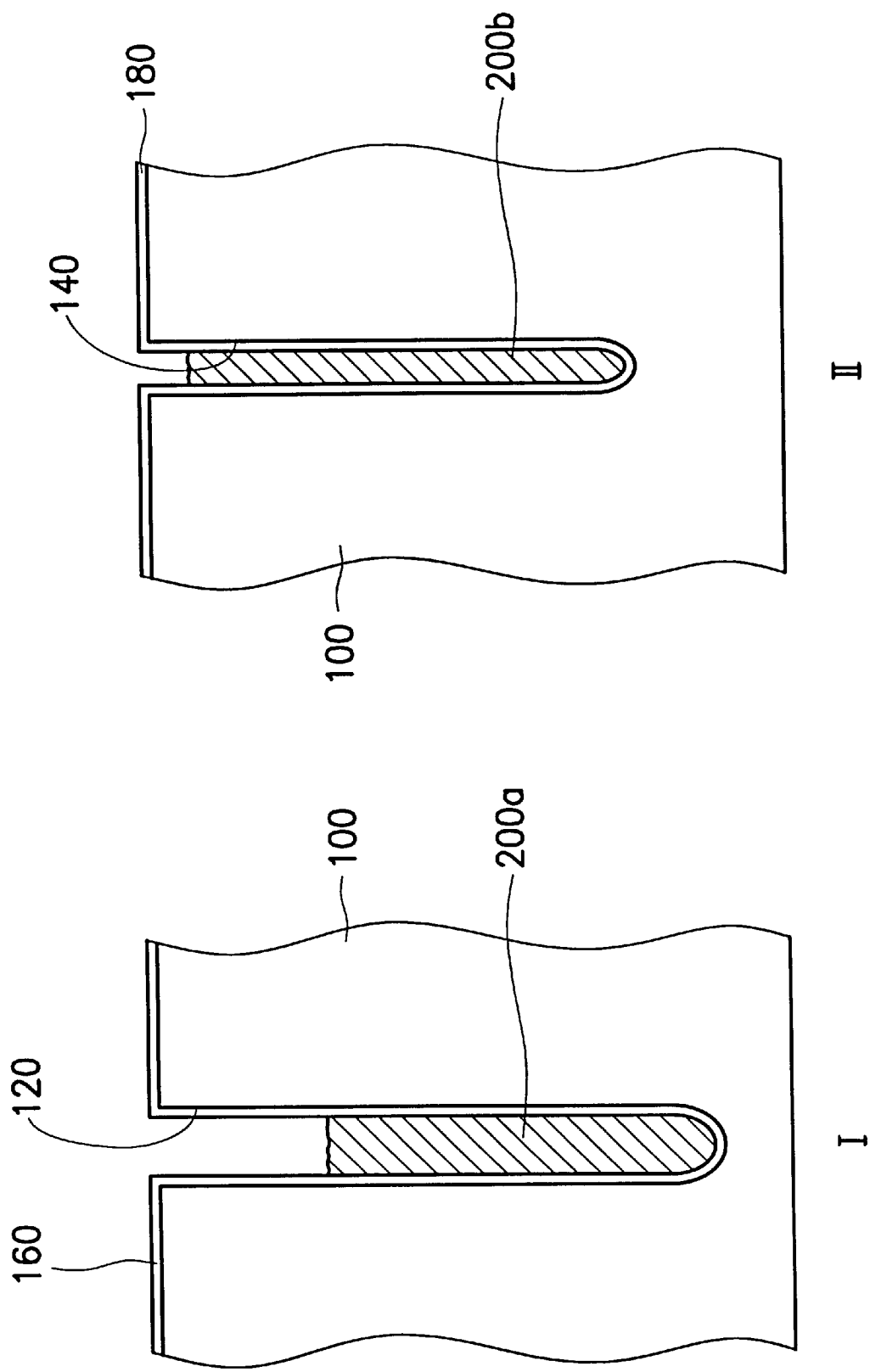

Referring now to FIG. 2C, the organic material 200 is partially removed by reactive ion etching (RIE) to respectively leave an organic material 200a within the first trench 120 and an organic material 200b within the second trench 140. In this step, the thicknesses of the removed organic material are similar on the two areas.

Figure 2D:
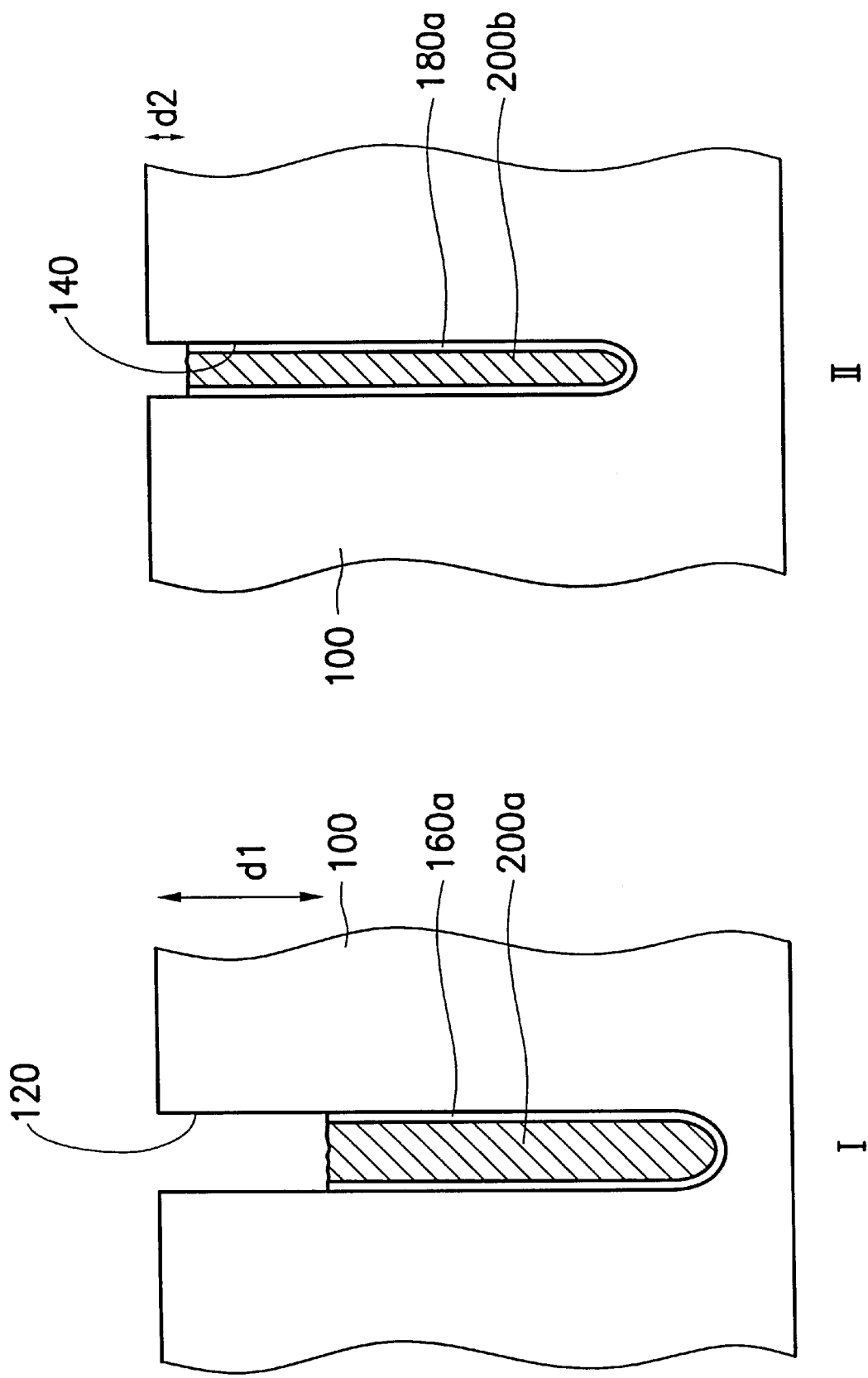

Then, as shown in FIG. 2D, a wet etching step is used to remove the exposed thermal oxide layer 160 and the exposed thermal oxide layer 180 so as to leave a thermal oxide 160a and a thermal oxide 180a, while the organic material 200a and the organic material 200b are used as etching masks. As a result, the exposed depth d1 of the first trench 120 is larger than the exposed depth d2 of the second trench 140.

Figure 2E:
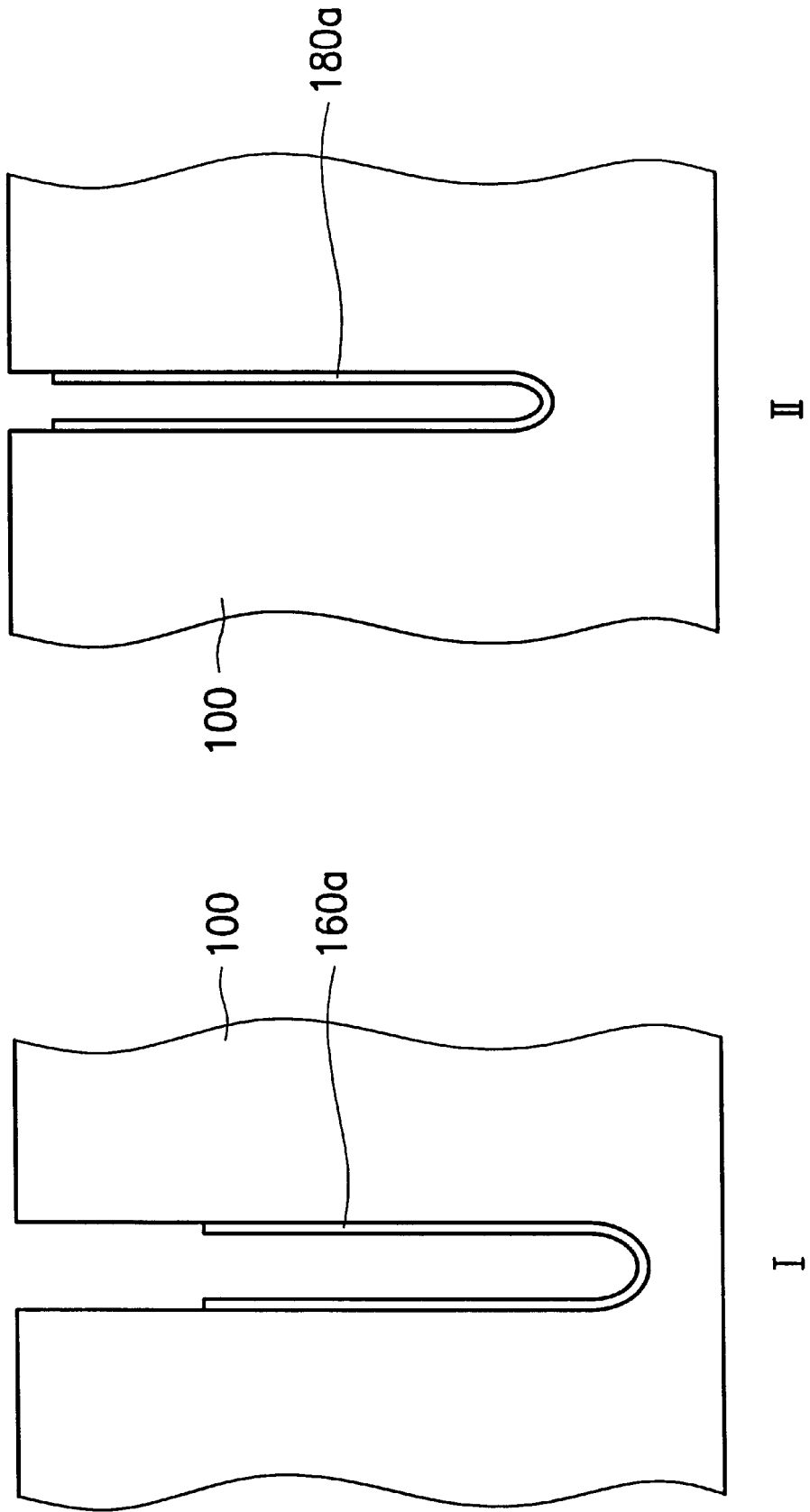
Figure 2F:
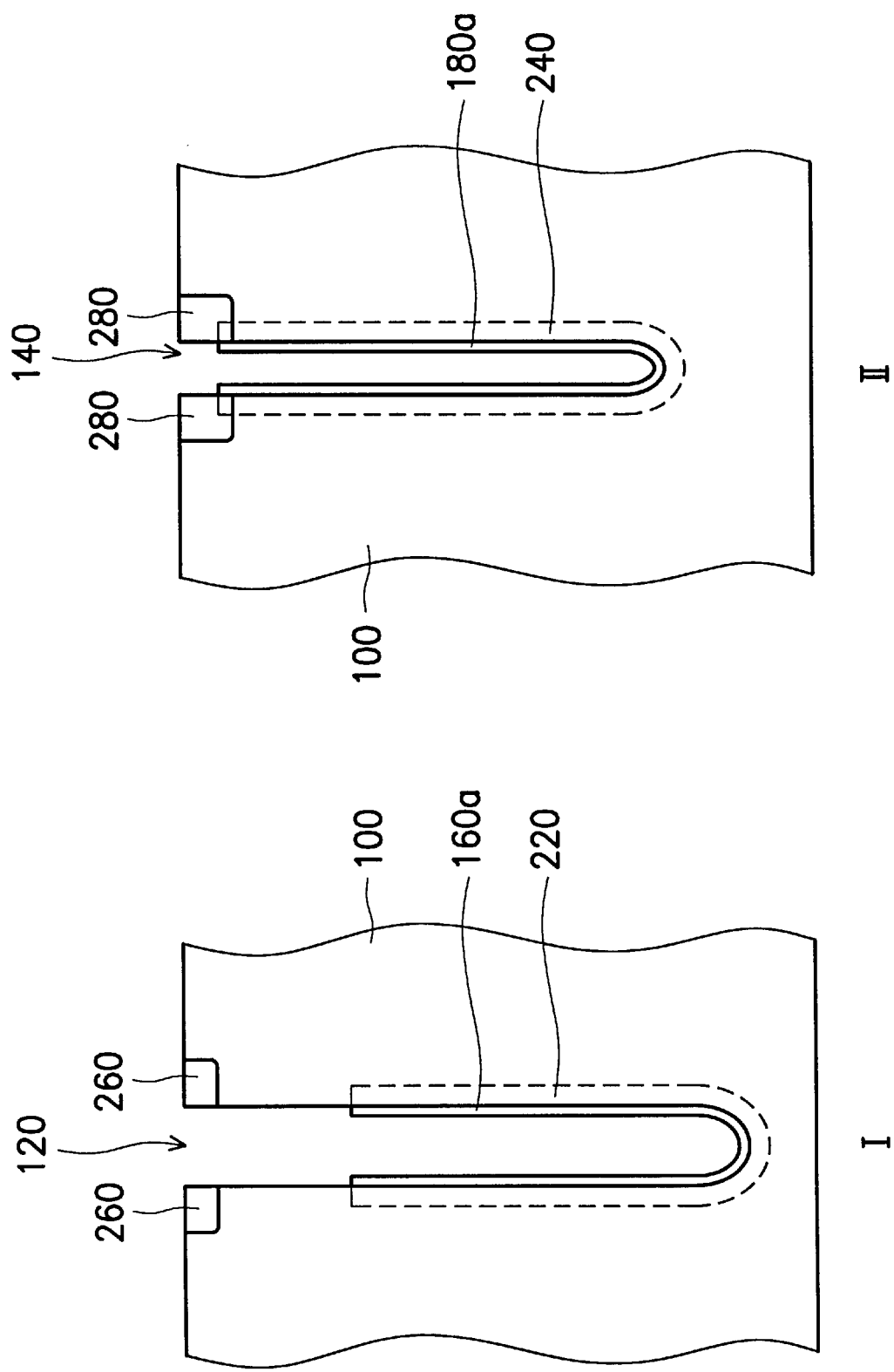
Figure 3:
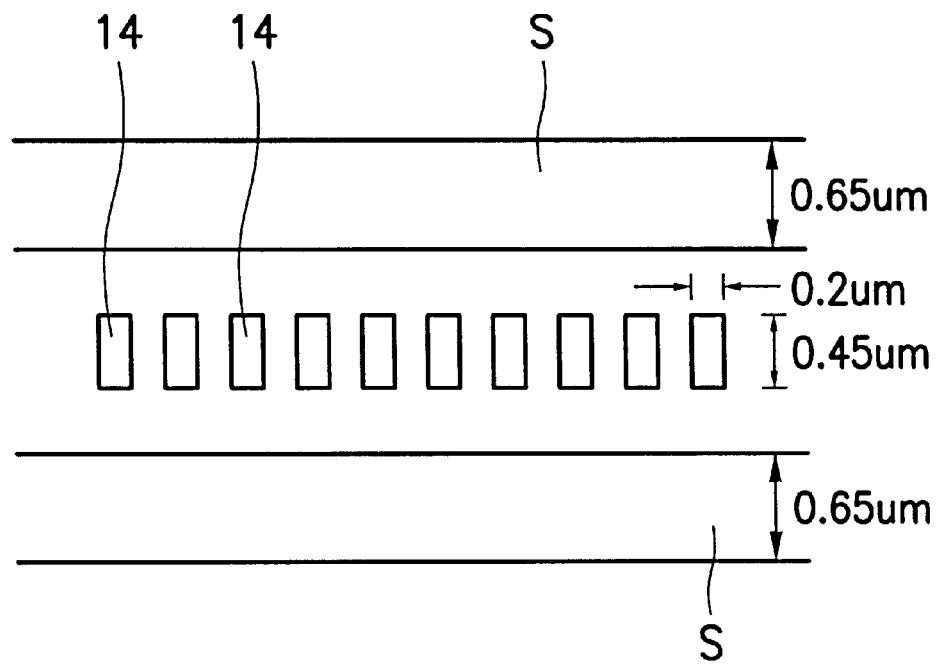
FIG. 3 is the top view of a guard ring area formed by the prior art.

Next, as shown in FIG. 2E, the remaining organic material 200a and the remaining organic material 200b are removed. Then, referring now to FIG. 2F, a thermal treatment is utilized so that the dopants of the thermal oxide 160a and the thermal oxide 180a are diffused into the adjacent semiconductor substrate 100 to respectively form a first doped plate 220 and a second doped plate 240. Next, a first doped strap 260 is formed on the upper surface of the semiconductor substrate 100 around the first trench 120; at the same time, a second doped strap 280 is formed on the upper surface of the semiconductor substrate 100 around the second trench 140 by arsenic or phosphorus implantation. Accordingly, the first doped strap 260 is separated from the first doped plate 220 by a predetermined distance; that is, they are disconnected. Moreover, the second doped strap 280 overlaps and is connected to the second doped plate 240.

According to the present invention, the second trench at guard ring area is smaller than first trench at memory array area so that the first doped strap and first doped plate are a predetermined distance apart. On the other hand, the second doped strap and the second doped plate are connected.

Formation of the N-well 30 used in the prior art is not necessary. As a result, it economizes the wafer area and reduces the manufacturing cost.

While the invention has been described with reference to various illustrative embodiments, the description is not intended to be construed in a limiting sense. Various modifications of the illustrative embodiments, as well as other embodiments of the invention, will be apparent to those persons skilled in the art upon reference to this description. It is therefore contemplated that the appended claims will cover any such modifications or embodiments as may fall within the scope of the invention defined by the following claims and their equivalents.

What is claimed is:

1. A DRAM having a guard ring, comprising:
   a semiconductor substrate having a memory array area and a guard ring area;
   a first trench disposed within said semiconductor substrate on said memory array area;
   a second trench disposed within said semiconductor substrate on said guard ring area;
   a first doped strap disposed on the upper surface of said semiconductor substrate around said first trench;
   a second doped strap disposed on the upper surface of said semiconductor substrate around said second trench;
   a first doped plate disposed on said semiconductor substrate around the bottom of said first trench, and separated from said first doped strap by a predetermined distance; and
   second doped plate disposed on said semiconductor substrate around the bottom of said second trench, and connected to said second doped strap.

2. A DRAM having a guard ring as claimed in claim 1, wherein said first trench and said second trench respectively have length-width dimensions of about 0.45 $\mu$m×0.2 $\mu$m and 0.2 $\mu$m×0.2 $\mu$m.

3. A DRAM having a guard ring as claimed in claim 1, wherein said first doped strap and said second doped strap comprise n-type dopants.

4. A DRAM having a guard ring as claimed in claim 3, wherein said first doped plate and said second doped plate comprise n-type dopants.

* * * * *